United States Patent
Kim et al.

(10) Patent No.: US 8,232,366 B2
(45) Date of Patent: Jul. 31, 2012

(54) TRANSPARENT, HIGHLY HEAT-RESISTANT POLYIMIDE PRECURSOR AND PHOTOSENSITIVE POLYIMIDE COMPOSITION THEREOF

(75) Inventors: Dong-seok Kim, Daejeon (KR); Yong-sik Ahn, Seoul (KR); Kyung-jun Kim, Daejeon (KR); Mi-hie Yi, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 10/550,591

(22) PCT Filed: Mar. 24, 2004

(86) PCT No.: PCT/KR2004/000640
§ 371 (c)(1),
(2), (4) Date: Sep. 13, 2006

(87) PCT Pub. No.: WO2004/086146
PCT Pub. Date: Oct. 7, 2004

(65) Prior Publication Data
US 2007/0093640 A1    Apr. 26, 2007

(30) Foreign Application Priority Data

Mar. 24, 2003  (KR) .................. 10-2003-0018127

(51) Int. Cl.
*C08G 69/26* (2006.01)
(52) U.S. Cl. ........ 528/335; 528/170; 528/171; 528/172; 528/173; 528/174; 528/310
(58) Field of Classification Search .................. 528/310, 528/170, 171, 172, 173, 174, 353; 524/606
See application file for complete search history.

(56) References Cited

U.S. PATENT DOCUMENTS

| | | | | | |
|---|---|---|---|---|---|
| 5,474,876 | A | * | 12/1995 | Haehnle et al. | 430/283.1 |
| 5,756,260 | A | * | 5/1998 | Sashida et al. | 430/283.1 |
| 6,159,654 | A | * | 12/2000 | Machida et al. | 430/270.1 |
| 6,642,393 | B2 | * | 11/2003 | Okada et al. | 549/242 |
| 6,664,021 | B1 | * | 12/2003 | Maeda et al. | 430/270.1 |
| 2002/0055610 | A1 | * | 5/2002 | Okada et al. | 528/314 |
| 2002/0093077 | A1 | * | 7/2002 | Jung et al. | 257/642 |
| 2004/0048004 | A1 | * | 3/2004 | Hosaka et al. | 428/1.26 |
| 2004/0048978 | A1 | * | 3/2004 | Okada et al. | 524/606 |

FOREIGN PATENT DOCUMENTS

| | | |
|---|---|---|
| EP | 0 679 633 | 11/1995 |
| JP | 9-95533 | 4/1997 |
| JP | 11-227099 | 8/1999 |
| JP | 2001-330721 | 11/2001 |
| KR | 2001-0027145 | 6/2001 |
| KR | 2001-111272 | 12/2001 |
| KR | 10-2002-0046229 | 6/2004 |
| WO | WO 00/06543 | 2/2000 |
| WO | WO 02/51909 | 7/2002 |

OTHER PUBLICATIONS

Berrada, M. et al., "Novel Negative-Type Soluble Photosensitive Polyimides: Synthesis and Characterization", Chem., vol. 8, No. 5 (1996), pp. 1029-1034.*
Kusama, et al. "Soluble Ployimides with Polyalicyclic Structure 3. Polyimides from (4arH,8acH)-Decahydro-1t, 4t:5c, 8c-dimethanonaphthalene-2t, 3t, 6c, 7c-tetracarboxylic 2, 3:6, 7-Dianhydride"; Macromolecules 1994, 27, 1117-1123; 1994 American Chemical Society.
Yamada, et a."Soluble Polyimides with Polyalicyclic Structure 2. Polyimides from Bicyclo [2.2.1] heptane-2-exo-3-exo-5-exo-6-exo-tetracarboxylic 2,3:5,6-Dianhydride" ;Macromolecules 1993. 26, 4961-4963; 1993 American Chemical Society.

* cited by examiner

*Primary Examiner* — Gregory Listvoyb
(74) *Attorney, Agent, or Firm* — McKenna Long & Aldridge LLP

(57) ABSTRACT

The present invention relates to an aqueous alkali-developable photosensitive polyimide precursor resin composition that is appropriate for highly heat-resistant transparent protection layers and insulation layers for liquid crystal display devices. In more detail, the present invention relates to a negative-type photosensitive transparent polyimide precursor resin composition manufactured in two steps. The first step is the manufacture of a transparent linear polyamic acid (A) from (a-1) one or more kinds of tetracarboxylic acid dianhydrides selected from alicyclic tetracarboxylic acid dianhydrides having 3 to 30 carbon atoms; and (a-2) one or more kinds of diamines selected from aliphatic, alicyclic, or non-conjugated aromatic diamines, having 3 to 30 carbon atoms, having one or more ethylenically unsaturated bonds at side chains as essential components; and the second step is the manufacture of reactive transparent polyimide precursors shown in the following Chemical Formula 1 according to the esterification reaction of the above polyamic acid (A) with ethylenically unsaturated compound (B) containing an epoxy group in the same molecule as the main component. The photosensitive transparent polyimide precursor resin compositions according to the present invention have a superior photosensitivity, and thus, may be used for transparent protection layers and insulation layers of liquid crystal display devices having superior heat resistance, chemical resistance, mechanical strength, and electricity insulation.

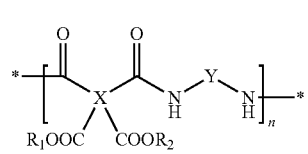

(1)

2 Claims, No Drawings

TRANSPARENT, HIGHLY HEAT-RESISTANT POLYIMIDE PRECURSOR AND PHOTOSENSITIVE POLYIMIDE COMPOSITION THEREOF This application claims priority to PCT/K2004/000640, filed on Mar. 24, 2004, and Korean Application Nos. 10-2003-0018127 filed Mar. 24, 2003, in Korea, all of which are hereby incorporated by reference in their entirety.

TECHNICAL FIELD

The present invention relates to an aqueous alkali developable photosensitive polyimide precursor resin composition that is appropriate for highly heat-resistant transparent protection layers and insulation layers for liquid crystal display devices. In more detail, the present invention relates to a negative-type photosensitive transparent polyimide precursor resin composition manufactured in two steps. The first step is the manufacture of a transparent linear polyamic acid (A) from (a-1) one or more kinds of tetracarboxylic acid dianhydrides selected from alicyclic tetracarboxylic acid dianhydrides having 3 to 30 carbon atoms; and (a-2) one or more kinds of diamines selected from aliphatic, alicyclic, or non-conjugated aromatic diamines, having 3 to 30 carbon atoms, having one or more ethylenically unsaturated bonds at side chains as essential components; The second step is the manufacture of reactive transparent polyimide precursors shown in the following Chemical Formula 1 according to the esterification reaction of the above polyamic acid (A) with ethylenically unsaturated compound (B) containing an epoxy group in the same molecule as the main component.

BACKGROUND ART

Generally, polyimide resins are manufactured through condensation polymerization of aromatic tetracarboxylic acid or its derivatives and aromatic diamine or aromatic diisocyanate, and thus manufactured polyimide resins have superior heat resistance, chemical resistance, mechanical and electrical properties. Photosensitive aromatic polyimides having such superior properties are widely used for electronic materials such as semiconductor encapsulant, etc.

However, aromatic polyimides are not appropriate for transparent protection layers or insulation layers for liquid crystal display devices in that they have low transmittance in the visible region, are colored in yellow or brown, and have a relatively high dielectric constant. Epoxy resins or acrylic resin compositions have been widely used as transparent protection layers or insulation layers for liquid crystal display devices. But their inherent heat resistance characteristics practically limits subsequent processing condition to below 230° C. When they are processed at temperatures of 250° C. or higher, severe decoloration and film contraction may occur.

Accordingly, polyimide materials have been taken into consideration in order to meet heat resistance and transparency simultaneously, and some methods of manufacture of polyimides by using alicyclic acid anhydrides have been reported as studies for obtaining transparent polyimide membrane or film (Macromolecules, 1994. 27, 1117 and 1993, 26, 4961, Japanese Patent Laid-Open No. PYUNGSUNG9-95533, Japanese Patent Laid-Open No. 2001-330721).

However, in order to use such non-photosensitive transparent polyimide resins as protection layers or insulation layers for liquid crystal display devices, the process of minute pattern formation by lithography process should be added after polyimide film formation on substrates composed of glasses, etc.

While the use of photosensitive transparent polyimide resin compositions is advantageous in view of cost reduction since the above-described process can be simplified, the photosensitive transparent polyimide resin composition using trans-1,4-diaminocyclohexane reported in Japanese Patent Laid-Open No. 2002-161136 is practically inapplicable due to too slow photosensitivity.

The inventors of the present invention has reported photosensitive transparent polyimide resin compositions in Korean Patent Application No. 10-2002-074070 leaving the development margin and photosensitivity to be improved further.

DISCLOSURE OF INVENTION

In order to resolve the above-described problems, an object of the present invention is to provide a negative-type photosensitive transparent polyimide precursor having enough photosensitivity, and to provide compositions that may be used for transparent protection layers and insulation layers for liquid crystal display devices having superior heat resistance, chemical resistance, mechanical strength, electrical insulation, and a method of preparing the same.

The foregoing and other objects, aspects, and advantages will be better understood from the following detailed description of preferred embodiments of the invention:

In order to achieve the above objects, the present invention provides reactive transparent polyimide precursors having the following Chemical Formula 1:

[Chemical Formula 1]

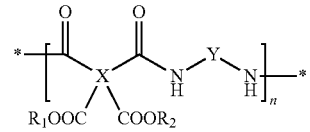

where X is a tetra-valent organic group induced from alicyclic tetracarboxylic acid dianhydrides having 3 to 30 carbon atoms; Y is a di-valent organic group induced from aliphatic, alicyclic, or non-conjugated aromatic diamines having 3 to 30 carbon atoms; $R_1$ and $R_2$ are hydrogen atoms or organic groups having 1 to 20 carbon atoms including one or more ethylenically unsaturated bonds, and $R_1$ and $R_2$ cannot be hydrogen atoms at the same time.

The acid value of the above reactive transparent polyimide precursors may be in the range of 30 to 200 mg KOH/g, and the molecular weight of the above reactive transparent polyimide precursors may be in the range of 2,000 to 200,000.

Also the present invention provides a method of preparing reactive transparent polyimide precursors of the above Chemical Formula 1, comprising the steps of: manufacturing a transparent linear polyamic acid (A) having (a-1) one or more kinds of tetracarboxylic acid dianhydrides selected from alicyclic tetracarboxylic acid dianhydrides having 3 to 30 carbon atoms, and (a-2) one or more kinds of diamines selected from aliphatic, alicyclic, or non-conjugated aromatic diamines having 3 to 30 carbon atoms including one or more ethylenically unsaturated bonds at side chains; and esterifing the transparent linear polyamic acid (A) with an ethylenically unsaturated compound (B) containing an epoxy group in the same molecule.

The above-described tetracarboxylic acid dianhydrides may be one or more kinds of anhydrides selected from 1,2,3,4-cyclobutanetetracarboxylic acid dianhydride (CBDA), 1,2,3,4-cyclopentanetetracarboxylic acid dianhydride (CPDA), bicyclooctene-2,3,5,6-tetracarboxylic acid dianhydride (BODA), 5-(2,5-dioxotetrahydrofuran-3-yl)-3-methylcyclohexene-1,2-dicarboxylic acid anhydride (DOCDA), 4-(2,5-dioxotetrahydrofuran-3-yl)-tetralin-1,2-dicarboxylic acid anhydride (DOTDA); and the above diamine may be one or more kinds of diamines selected from those having the general chemical formula shown in the following Chemical Formulas 7 to 9:

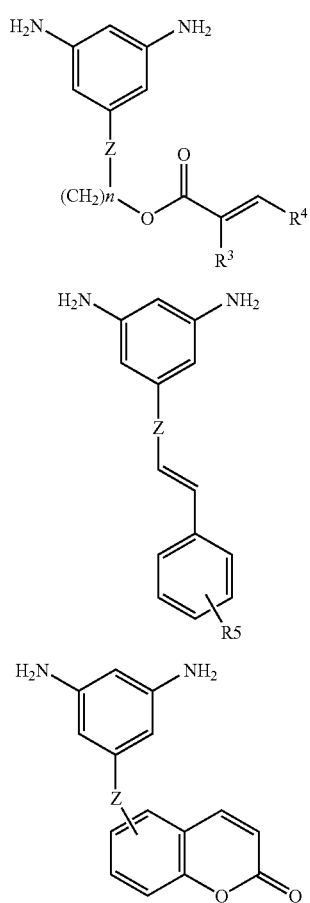

where Z is one of ester, amide, imide, ether, and carbonyl group; $R_3$, $R_4$, and $R_5$ are hydrogen atoms or alkyl or allyl groups having 1 to 20 carbon atoms; and n is an integer between 1 to 20.

The diamines in the above may be one or more kinds of compounds selected from the group consisting of 2-(methacryloyloxy)ethyl 3,5-diaminobenzoate, 3,5-diaminophenyl cinnamate, and coumaronyl 3,5-diaminobenzoate.

The above ethylenically unsaturated compound (B) containing an epoxy group in the same molecule may be one or more kinds of compounds selected from the group consisting of allyl glycidyl ether, glycidyl acrylate, glycidyl methacrylate, 3,4-epoxycyclohexylmethyl acrylate, 3,4-epoxycyclohexylmethyl methacrylate, glycidyl 5-norbornene-2-carboxylate (a mixture of endo and exo), glycidyl 5-norbornene-2-methyl-2-carboxylate (a mixture of endo and exo), 1,2-epoxy-5-hexene, and 1,2-epoxy-9-decene.

The present invention also can be characterized by providing photosensitive polyimide precursor resin compositions using the above-mentioned transparent polyimide precursors and one or more kinds of photo-initiators as essential components, and adding one or more kinds of compounds selected from the group consisting of photosensitizers, multifunctional monomers, and common coating additives.

The portion of the above-described reactive transparent polyimide precursors may be 10 to 99 weight %, and that of the photo-initiators may be 0.1 to 90 weight %, based on the amount of total solids.

Thickness of polyimide films coated and postbaked may be 0.5 to 100 μm; thermal decomposition temperature of polyimide films in the range of 300 to 500° C.; transmittance between 400 to 700 nm of polyimide films of the above compositions 90% or higher; and dielectric constant measured at 1 kHz of the above compositions in the range of 2.5 to 4.0.

The present invention can also provides transparent protection layer or insulation layer, which is prepared by using the photosensitive polyimide precursor resin compositions obtained in the above.

Further, the present invention can provide a liquid crystal display device which is manufactured by applying the photosensitive polyimide precursor resin compositions obtained in the above to its transparent protection layer or insulation layer.

Still further, the present invention can provide a liquid crystal display device which is prepared by applying the photosensitive polyimide precursor compositions to the organic insulation materials for liquid crystal display devices.

Hereinafter, the present invention is described in more detail as follows:

(a-1) is one or more kinds of tetracarboxylic acid dianhydrides selected from alicyclic tetracarboxylic acid dianhydrides having 3 to 30 carbon atoms, of which concrete examples include, but are not limited to, 1,2,3,4-cyclobutanetetracarboxylic acid dianhydride (CBDA shown in Chemical Formula 2), 1,2,3,4-cyclopentanetetracarboxylic acid dianhydride (CPDA shown in Chemical Formula 3), bicyclooct-7-ene-2,3,5,6-tetracarboxylic acid dianhydride (BODA shown in Chemical Formula 4), 5-(2,5-dioxotetrahydrofuran-3-yl)-3-methylcyclohexene-1,2-dicarboxylic acid anhydride (DOCDA shown in Chemical Formula 5), 4-(2,5-dioxotetrahydrofuran-3-yl)-tetralin-1,2-dicarboxylic acid anhydride (DOTDA shown in Chemical Formula 6), etc.

Also, if it is necessary, aromatic tetracarboxylic acid dianhydrides selected from the group consisting of pyromellitic acid dianhydride, benzophenone tetracarboxlic acid dianhydride, oxydiphthalic acid dianhydride, hexafluoroisopropylidenediphthalic acid dianhydride, etc. may be used as well as long as they do not deteriorate the transparency of the polyimides.

[Chemical Formula 2]

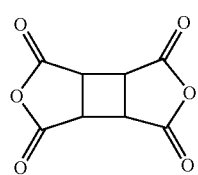

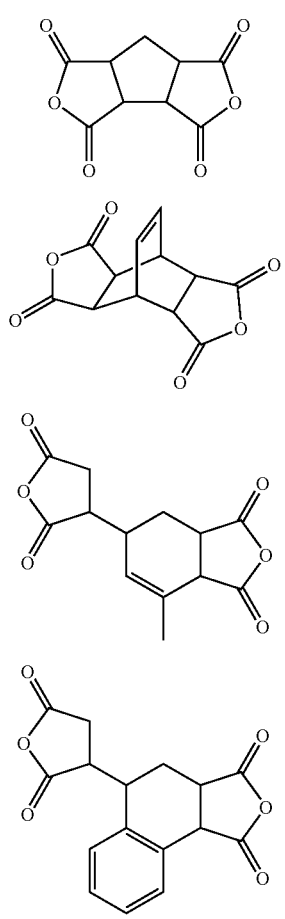

[Chemical Formula 3]

[Chemical Formula 4]

[Chemical Formula 5]

[Chemical Formula 6]

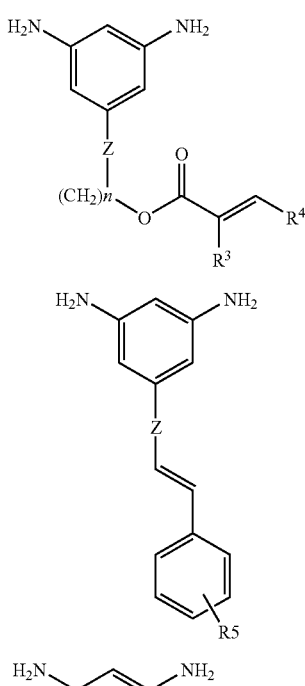

[Chemical Formula 7]

[Chemical Formula 8]

[Chemical Formula 9]

(a-2) is one or more kinds of diamines selected from aliphatic, alicyclic, or non-conjugated aromatic diamines having 3 to 30 carbon atoms including one or more ethylenically unsaturated bonds at side chains as essential components, of which concrete examples include 2-(methacryloyloxy)ethyl 3,5-diaminobenzoate (Chemical Formula 7, $R_3=CH_3$, $R_4=H$, Z=COO, n=2), 3,5-diaminophenyl cinnamate (Chemical Formula 8, R5=H, Z=OCO), coumaronyl 3,5-diaminobenzoate (Chemical Formula 9, Z=COO), etc. (where Z is one of ester, amide, imide, ether, carbonyl group, etc.; $R_3$, $R_4$, and $R_5$ are hydrogen atoms or alkyl or allyl groups having 1 to 20 carbon atoms; and n is an integer between 1 to 20). Also, if necessary, diamines not including ethylenically unsaturated bonds in the same molecule may be used as well as long as they do not deteriorate the transparency and chemical resistance of the polyimides thus formed. Their concrete examples include, but are not limited to, one or more kinds of compounds selected from the group consisting of 1,2-diaminocyclohexane, 1,3-diaminocyclohexane, 1,4-diaminocyclohexane, para-phenylenediamine (p-PDA), meta-phenylenediamine (m-PDA), 4,4-oxydianiline (ODA), 4,4-methylenedianiline (MDA), 2,2-bis(aminophenyl)hexafluoropropane (HFDA), meta-bis(aminophenoxydiphenyl)sulfone (m-BAPS), para-bis(aminophenoxydiphenyl)sulfone (p-BAPS), 1,4-bis(aminophenoxy)benzene (TPE-Q), 1,3-bis(aminophenoxy)benzene (TPE-R), 2,2-bis(aminophenoxyphenyl)propane (BAPP), 2,2-bis(aminophenoxyphenyl)hexafluoropropane (HFBAPP), 5-diaminobenzoic acid, 2,4-diaminobenzenesulfonic acid, 2,5-diaminobenzenesulfonic acid, bis(aminopropyl)tetramethyldisiloxane, etc.

Hereinafter, a method of preparing a reactive transparent polyimide precursor according to the present invention is described as follows:

<Step 1: Synthesis of Transparent Linear Polyamic Acid (A)>

In the first step, the transparent linear polyamic acid (A) is manufactured from tetracarboxylic acid dianhydrides in (a-1) and diamines in (a-2) in the usual method of manufacturing polyamic acid. In other words, it is possible to obtain linear polyamic acid (A) quantitatively by adding tetracarboxylic acid dianhydride to diamine slowly, which is then reacted for 24 hours in a reactor, of which temperature can be controlled, while maintaining the temperature below room temperature.

The solvent used for polymerization is one or more kinds of solvents selected from the group consisting of meta-cresol, N-methyl-2-pyrrolidone (NMP), dimethylformamide (DMF), dimethylacetamide (DMAc), γ-butyrolactone, 2-butoxyethanol, and 2-ethoxyethanol. In some cases, organic acid such as para-toluene sulfonic acid, hydroxybenzoic acid, crotonic acid, etc. or an organic amine derivative, maybe added up to 5 weight % as an imidization catalyst relative to the total amount of the above reaction mixture. Further, hydroquinone or similar compound may be used as a thermopolymerization inhibitor in the range of 30 to 500 ppm relative to the weight of the polymer. Still further, adhesion may be improved by adding a siloxane diamine derivative within a range of 0.5 to 50 weight % with respect to the total amount of diamine necessary.

The average molecular weight (Mw) of the linear polyamic acid thus obtained is characterized by being in the range of 2,000 to 200,000. If the molecular weight is less than 2,000, it is difficult to form films thereafter; if it is higher than 200,000, it may be difficult to handle them due to excessively high viscosity, and the degree of planarization of the films formed thereafter may be worsened. The linear polyamic acid thus obtained shows photosensitivity when coupled with an appropriate photo-initiator without multi-functional monomer since it has ethylenically unsaturated bonds at polymer side chain. Also, it is advantageous to obtain films having superior chemical resistance after postbaking of polyamic acid. However, the linear polyamic acid without subsequent treatment has a problem of narrow development margin since its solubility in an alkali developer is very good. <Step 2: Esterification with Ethylenically Unsaturated Compound (B)>

In the second step, to control the solubility of the linear polyamic acid in the alkali developer and to endow additional reactive site, the alkali-soluble linear polyamic acid (A) is esterified with an ethylenically unsaturated compound (B) having an epoxy group in the same molecule. The compound (B) includes allyl glycidyl ether, glycidyl(meth)acrylate, 3,4-epoxycyclohexyl(meth)acrylate, glycidyl 5-norbornene-2-carboxylate (a mixture of endo and exo), glycidyl 5-norbornene-2-methyl-2-carboxylate (a mixture of endo and exo), 1,2-epoxy-5-hexene, 1,2-epoxy-9-decene, etc., which may be used singly or in combination with two or more kinds of compounds during esterification. It is preferable to use 10 to 400% equivalent weight of the compound (B) with respect to that of the total carboxylic acid group in the linear polyamic acid (A). If this range is deviated, there may be problems such as difficulty in controlling the solubility to the developer or reduced heat resistance of the films thus formed.

The acid value of the reactive transparent polyimide precursor thus obtained is about 30 to 200 mg KOH/g, and the average molecular weight is within a range of 2,000 to 200,000, and more preferably, within a range of 5,000 to 100,000.

The reactive transparent polyimide precursors obtained in the above as shown in Chemical Formula 1 has more ethylenically unsaturated bonds per structural unit compared to those of the linear polyamic acid (A), and therefore, it is possible to manufacture negative-type photosensitive resin compositions with enough development margin without additional multi-functional monomers; to reduce the amount of photo-initiator necessary; and to improve photosensitivity.

Hereinafter, a method of manufacturing negative-type photosensitive transparent polyimide precursor resin compositions by using the reactive transparent polyimide precursors obtained in the above is described.

In order to manufacture a negative-type photosensitive transparent polyimide precursor resin composition with the alkali developability, an appropriate photo-initiator (C) should be used, and if necessary, photosensitizer (D), multi-functional monomer (E), additive (F), etc. may be used in combination with the above.

The above alkali-soluble reactive transparent polyimide precursor (shown in Chemical Formula 1) may be used singly or in combination with two or more kinds. It is preferable to use the reactive transparent polyimide precursor in an amount of 10% to 99% of the total solid portion of the photosensitive transparent polyimide precursor resin compositions. If it is less than 10%, the adhesion of the films thus formed is decreased; if it is greater than 99%, there may be a problem of low photosensitivity.

Examples of the photo-initiator (C) include benzophenone, 4,4'-bis(N,N-diethylamino)benzophenone, 4,4'-bis(N,N-dimethylamino)benzophenone, phenylbiphenyl ketone, 1-hydroxy-1-benzoylcyclohexane, benzil, benzyldimethyl ketal, 2-benzyl-2-(dimethylamino)-4'-morpholinobutyrophenone, 2-methyl-4'-(methylthio)-2-morpholinopropiophenone, thioxanthone, 1-chloro-4-propoxythioxanthone, isopropyl thioxanthone, diethyl thioxanthone, ethyl anthraquinone, 4-benzoyl-4'-methyldiphenyl sulfide, benzoyl butyl ether, 2-hydroxy-2-benzoyl propane, 2-hydroxy-2-(4'-isopropyl)benzoyl propane, 4-butylbenzoyltrichloromethane, 4-phenoxy benzoyldichloromethane, benzoyl formic acid methyl, 1,7-bis(9'-acrydinyl)heptane, 9-n-butyl-3,6-bis(2'-morpholinoisobutyroyl)carbazole, 2,4,6-trimethylbenzoyl diphenylphosphin oxide, etc.

It is preferable to use 0.1 to 90 weight % of photo-initiator relative to the amount of a polymer, more preferably, within a range of 0.2 to 50 weight %. If it deviates from this range, there may be problems like no photo-polymerization or reduced developability, etc.

As a photosensitizer (D), a coumarine derivative such as 3,3'-carbonyl bis(dimethylamino)coumarine, etc., an aromatic carbonyl compound such as fluorenone, etc., an amine derivative such as triethylamine, etc., a methylenethiazole derivative such as 1,2-dihydronaphtho[1,2,d]thiazole, etc. may be used.

A multi-functional monomer (E) may be one of compounds having one or more ethylenically unsaturated groups that may be additionally polymerized in a molecule and with a boiling point of 100° C. or higher. Examples include phenoxyethyl methacrylate, polyethyleneglycol(meth)acrylate, polypropyleneglycol(meth)acrylate, trimethylolethane tri(meth)acrylate, trimethylolpropane tri(meth)acrylate, neopentyl glycol(meth)acrylate, pentaerythritol triacrylate, pentaerythritol tetraacrylate, dipentaerythritol pentacrylate, dipentaerythritol hexacrylate, etc.

Also, functional monomers include caprolactone-modified KAYARAD DPCA-20, KAYARAD DPCA-30, KAYARAD DPCA-60, KAYARAD DPCA-120, etc. in the form of being introduced to dipentaerythritol; KAYARAD TC-110S introduced to tetrahydrofurfuryl acrylate, KAYARAD HX-220, KAYARAD HK-620, etc. introduced to neopentyl glycol hydroxypivalate, etc.

Other functional monomers include epoxy acrylates, novolak-epoxy acrylates that are bisphenol A derivatives; U-324A, U15HA, U-4HA, etc. that are urethane-group multi-functional acrylates. Functional monomers having ethylenically unsaturated double bonds may be used singly or in combination with two or more kinds of monomers.

If necessary, additives (F) that are generally used as coating agents can be included. Examples of F are thermopolymerization inhibitors such as hydroquinone, 4-methoxyphenol, quinone, pyrocatechol, t-butyl catechol, phenothiazine, etc.; plasticizers; silicone-type adhesion promotors; fillers; surfactants; etc.

Described below is a method of pattern formation by using a negative-type photosensitive transparent polyimide precursor resin composition of the present invention, and then forming a heat-resistant transparent polyimide film:

<Step 1>

A photosensitive polyimide precursor resin composition is coated on substrates. For substrates, glass or transparent plastic can be used in view of the characteristics of liquid crystal display devices, but not limited as long as they meet the object of displaying. As to the method of coating the photosensitive resin composition of the present invention on the surface of a substrate, various kinds of coating methods such as spraying, roll coating, slit nozzle coating, rotatory coating, extrusion coating, bar coating, etc. and combination of two or more kinds of the above methods can be adopted. The thickness of coated films varies according to the method of coating, concentration of solids in the composition, viscosity, etc., but is usually 0.5 to 100 μm after they are dried.

<Step 2>

In order to form non-fluxionary film after coating, prebake process, in which the solvent is volatilized under vacuum, infrared and/or heat, is performed. Conditions for heating vary according to the kind or mixing ratio of each component, but usually in the range of 60 to 130° C. for 5 to 500 seconds on a hot plate, or 60 to 140° C. for 20 to 1,000 seconds in an oven.

<Step 3>

Thereafter, thin film of photosensitive polyimide precursor resin composition is exposed using a mask having a predefined pattern. Exposure can be done by far-UV light such as eximer laser, etc., UV, visible light, e-beam, x-ray, etc. In the present invention, it is preferable to use g-line (having a wavelength of 436 nm), h-line (having a wavelength of 405 nm), and i-line (having a wavelength of 365 nm) of mercury lamp. Exposure can be carried out by contact, proximity, or projection method.

<Step 4>

Whether to perform post-exposure bake (PEB) prior to alkali development is optional. PEB step may be introduced if necessary. PEB temperature is normally lower than 150° C., and PEB time is about 0.1 to 10 minutes.

<Step 5>

In the development process, non-exposed part of the film is removed by alkali developer. For the developer, an aqueous alkali solution composed of mineral alkalis such as sodium hydroxide, potassium hydroxide, sodium carbonate, sodium silicate, sodium meta-silicate, ammonia, water, etc.; primary amines such as ethylamine, n-propylamine, etc.; secondary amines such as diethylamine, di-n-propylamine, etc.; tertiary amines such as triethylamine, methyldiethylamine, n-methylpyrrolidone, etc.; alcohol amines such as dimethylethylalcohol amine, triethylalcohol amine, etc.; quarternary ammonium salts such as tetramethyl ammonium hydroxide, tetraethyl ammonium hydroxide, choline, etc.; and amines such as pyrrole, piperidine, etc. may be used.

It is also possible to use an aqueous solution in which an appropriate amount of water-soluble organic solvent such as methyl alcohol, ethyl alcohol, propyl alcohol, isopropyl alcohol, propylene glycol monomethyl ether, dipropylene glycol monomethyl ether, etc.; and surfactant; etc. is added. Development time is usually about 10 to 200 seconds. Dipping, spraying, puddle, etc. are applicable for the development method. After development, deionized (DI) water rinse is done for 20 to 200 seconds, and moisture on the substrate is removed by spin drying or blowing compressed air or nitrogen to give a desired pattern on the substrate.

<Step 6>

After development, polyimide precursor films are converted into heat-resistant polyimide films through postbake (also called hardbake) on a hot plate or in an oven. Baking is usually done at 150° C. to 300° C. for 1 to 120 minutes on a hot plate, or for 10 to 120 minutes at the same temperature range in an oven. Completely cross-linked and hardened polyimide pattern is obtained after postbake.

It is seen that the thermal decomposition temperature of polyimide films thus formed is in the range of 300 to 500° C., and transmittance between 400 to 700 nm is higher than 90%. It is also seen that the dielectric constant measured at 1 kHz is within a range of 2.5 to 4.0.

Heat-resistant polyimide films formed from the negative-type photosensitive polyimide resin compositions of the present invention are used for protection layers, insulation layers, etc. of liquid crystal display devices.

Additional features and advantages of the invention will be set forth in the description which follows, and in part will become apparent from the description, or may be learned by practice of the invention.

MODES FOR CARRYING OUT THE INVENTION

First, polyimide precursors used for preferred embodiments and comparative examples are synthesized in the following synthetic examples, and the linear polyamic acid used for the following synthetic examples is synthesized according to a known method. This is also described in detail in Korean Patent Application No. 10-2002-074070 which is invented by the present inventors. In other words, diamine is dissolved in solvent under nitrogen gas flow in a reactor to which a mixer, temperature controller, nitrogen inlet, and cooler are attached, and mixed while slowly adding tetracarboxlic acid dianhydride, where the reaction temperature is maintained below room temperature. The yield of the polymerization reaction is quantitative when the compounds are reacted for 12~24 hours.

SYNTHETIC EXAMPLE 1

A 100 g portion of the linear polyamic acid solution (20% solids, acid value of 220 mg KOH/g, Mw=18,000) synthesized by reacting 1,2,3,4-cyclobutanetetracarboxylic acid dianhydride (CBDA) and 2-(methacryloyloxy)ethyl 3,5-diaminobenzoate (DA-HEMA) in N-methyl-2-pyrrolidine (NMP)/γ-butyrolactone (volume ratio=1/1) co-solvent is charged in a 250-ml round-bottom flask, stirred, and heated to 110° C. under nitrogen atmosphere.

Reactive polyimide precursor 1 is synthesized by adding 20 g of glycidyl methacrylate to the flask slowly in an hour, and allowing to react for two hours. The acid value of the reactive polyimide precursor thus obtained is 120 mg KOH/g.

SYNTHETIC EXAMPLE 2

Reactive polyimide precursor 2 is synthesized in the same method as that in Synthetic Example 1 except that the linear polyamic acid (20% solids, acid value of 240 mg/g, Mw=22,000) is synthesized from 3,5-diaminophenyl cinnamate instead of 2-(methacryloyloxy)ethyl 3,5-diaminobenzoate in the above Synthetic Example 1. The acid value of the reactive polyimide precursor thus obtained is 160 mg KOH/g.

SYNTHETIC EXAMPLE 3

Reactive polyimide precursor 3 is synthesized in the same method as that in Synthetic Example 1 except that the linear polyamic acid (20% solids, acid value of 240 mg/g, Mw=22,000) is synthesized from coumaronyl 3,5-diaminobenzoate instead of 2-(methacryloyloxy)ethyl 3,5-diaminobenzoate in the above Synthetic Example 1. The acid value of the polyimide precursor thus obtained is 130 mg KOH/g.

SYNTHETIC EXAMPLE 4

Reactive polyimide precursor 4 is synthesized in the same method as that in Synthetic Example 1 except that the linear polyamic acid (20% solids, acid value of 200 mg/g, Mw=26,000) is synthesized from 4,4-oxydianiline (ODA) instead of 2-(methacryloyloxy)ethyl 3,5-diaminobenzoate in the above Synthetic Example 1. The acid value of the polyimide precursor thus obtained is 140 mg KOH/g.

SYNTHETIC EXAMPLE 5

Reactive polyimide precursor 5 is synthesized in the same method as that in Synthetic Example 1 except that the linear polyamic acid (20% solids, acid value of 230 mg/g, Mw=28,000) is synthesized from pyromellitic acid dianhydride (PMDA) and 4,4-oxydianiline instead of 1,2,3,4-cyclobutanetetracarboxylic acid dianhydride (CBDA) and 2-(methacryloyloxy)ethyl 3,5-diaminobenzoate in the above Synthetic Example 1. The acid value of the reactive polyimide precursor thus obtained is 140 mg KOH/g.

By using reactive polyimide precursors manufactured in the above synthetic examples, photosensitive resin compositions in the following comparative examples and preferred embodiments are manufactured:

[Preferred Embodiment 1]

Photosensitive polyimide precursor resin composition 1 is manufactured by dissolving 0.5 g of CGI124 as a photopolymerization initiator and 0.01 g of BYK307 as a surfactant in 50 g of the reactive polyimide precursor 1 solution manufactured in Synthetic Example 1 and filtering the mixture with a 0.2μm filter. Films are formed by spin-coating the above composition 1 on a glass substrate and pre-baking on a 100° C.-hot plate for 90 seconds. A photomask is put onto the films thus obtained, and 20 mW/cm$^2$ UV light is irradiated at 365 nm for 10 seconds by using a mercury lamp. A pattern is formed by developing the films with 2.38 weight % tetramethylammonium hydroxide aqueous solution at room temperature for 20 seconds, and washing it with DI water for 10 seconds. They are then hardened by postbake step in an oven at 250° C. for 1 hour. The minimum line width of the films thus obtained is 25 μm (for 1:1 line/space pattern), and the thickness is 1.2 μm.

[Preferred Embodiment 2]

The same processes as those in Preferred Embodiment 1 are performed except that the reactive polyimide precursor solution 2 manufactured in Synthetic Example 2 is used. The minimum line width of the films thus obtained is 25 μm, and the thickness is 1.2 μm.

[Preferred Embodiment 3]

The same processes as those in Preferred Embodiment 1 are performed except that the reactive polyimide precursor solution 3 manufactured in Synthetic Example 3 is used. The minimum line width of the films thus obtained is 30 μm, and the thickness is 1.2 μm.

COMPARATIVE EXAMPLE 1

The same processes as those in Preferred Embodiment 1 are performed except that the reactive polyimide precursor solution 4 manufactured in Synthetic Example 4 is used. The minimum line width of the films thus obtained is 50 μm, and the thickness is 1.2 μm.

COMPARATIVE EXAMPLE 2

The same processes as those in Preferred Embodiment 1 are performed except that the reactive polyimide precursor solution 5 manufactured in Synthetic Example 5 isused. The minimum line width of the films thus obtained is 50 μm, and the thickness is 1.2 μm.

COMPARATIVE EXAMPLE 3

The same processes as those in Preferred embodiment 1 are performed by using the linear polyamic acid (20% solids, acid value of 220 mg KOH/g, Mw=18,000) which is not reacted with glycidyl methacrylate in Synthetic Example 1 instead of the reactive polyimide precursor solution 1, where it is not possible to obtain a desired pattern having a appropriate shape, since the pattern is swept away in the process of development. In order to prevent pattern loss, post-exposure bake step at 160° C. for 10 minutes should be added before development. Then, it is possible to form a desired pattern, where the minimum line width of the pattern thus obtained is 40 μm, and the thickness is 1.2 μm.

TESTING EXAMPLE

Physical properties of polyimide films obtained from the photosensitive polyimide compositions in the above preferred embodiments are measured in a method described below, and the results are shown in Table 1:

<Evaluation of Heat Resistance>

After the polyimide pattern is formed, the change in its thickness by thermal impact is monitored. It may be said that, the smaller the change in its thickness at high temperature, the better the heat resistance of the film is. The ratio of the post-baked film thickness to pre-baked film thickness is defined as residual film ratio. If it is greater than 95% after processing at 250° C. for 1 hour, it is defined to be superior; if it is less than that, it is defined to be inferior.

<Evaluation of Transmittance>

After the polyimide pattern is formed, the transmittance between 400 nm to 700 nm is measured. If the transmittance is greater than 90%, it is defined to be superior; if it is less than that, it is defined to be inferior.

<Evaluation of Chemical Resistance>

Chemical resistance is examined by observing the change in the thickness when the films are dipped into chemicals (10% NaOH aqueous solution, 10% HCl aqueous solution, and NMP). ((Film thickness before treatment−Film thickness after treatment)/(Film thickness before treatment))*100 (%) is defined to be the ratio of change in thickness. The smaller the ratio of change in thickness when they are treated to chemical substances, the better the chemical resistance. When the ratio of change in thickness after dipping into chemical substances at room temperature for 1 hour is within ±3%, it is defined to be superior; when it exceeds that range, it is defined to be inferior.

<Evaluation of Planarization>

In order for films to be used for transparent protection layers for liquid crystal display devices, degree of planarization of the films on topographical substrate is important. Degree of planarization is defined to be (1—(step height after coating)/(step height before coating))*100 (%). For evaluation of the degree of planarization, 10 μm Line/10 μm Space (1:1) repetitive pattern with 1.0 μm step height before coating is used. If degree of planarization is greater than 70%, it is defined to be superior; if it is less than that, it is defined to be inferior.

TABLE 1

| Composition | Film thickness (μm) | Heat resistance | Transmittance | Chemical resistance | Degree of planarization | Minimum line width |
|---|---|---|---|---|---|---|
| Preferred Embodiment 1 | 1.2 μm | Superior | Superior | Superior | Superior | 25 μm |
| Preferred Embodiment 2 | 1.2 μm | Superior | Superior | Superior | Superior | 25 μm |
| Preferred Embodiment 3 | 1.2 μm | Superior | Superior | Superior | Superior | 30 μm |
| Comparative Example 1 | 1.2 μm | Superior | Superior | Inferior | Inferior | 50 μm |
| Comparative Example 2 | 1.2 μm | Superior | Inferior | Inferior | Inferior | 50 μm |
| Comparative Example 3 | 1.2 μm | Superior | Superior | Inferior | Superior | 40 μm |

As seen in the above Table 1, in case of polyimide films of Preferred Embodiments 1 to 3 of the present invention, it is seen that their transmittance, chemical resistance, and degree of planarization are superior compared to those of Comparative Examples 1 and 2. It is also seen that polyimide films show superior properties without additional process compared to Comparative Example 3 which is a conventional method.

INDUSTRIAL APPLICABILITY

As described in the above, the present invention can provide a negative-type photosensitive polyimide precursor composition having superior heat resistance, transmittance, chemical resistance, and degree of planarization, and thus is useful in that the above compositions may be applicable for transparent protection layers or insulation layers of liquid crystal display devices.

While the invention has been described in terms of a few preferred embodiments, those skilled in the art will recognize that the invention can be practiced with modification within the spirit and scope of the appended claims.

What is claimed is:

1. A reactive transparent polyimide precursor having the structure in the following Chemical Formula 1:

<Chemical Formula 1>

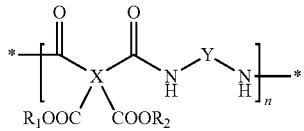

where X is a tetra-valent organic group derived from alycyclic tetracarboxylic acid dianhydrides having 3 to 30 carbon atoms;

Y is a di-valent organic group derived from aliphatic, alicyclic, or non-conjugated aromatic diamines which have 3-30 carbon atoms and side chains, wherein the side chains have one or more ethylenically unsaturated bonds capable of being crosslinked by a radical; and $R_1$ and $R_2$ are, independent of each other, a hydrogen atom or an organic group having 1 to 20 carbon atoms including one or more ethylenically unsaturated bond(s), provided that $R_1$ and $R_2$ are not hydrogen atoms at the same time, wherein the acid value of said reactive transparent polyimide precursor is within a range of 30 to 200 mg KOH/g, and said reactive transparent polyimide precursor is a negative type photosensitive precursor, wherein $R_1$ and $R_2$ including one or more ethylenically unsaturated bond(s) are derived from one or more compounds selected from the group consisting of allyl glycidyl ether, glycidyl acrylate, glycidyl methacrylate, 3,4-epoxycyclohexylmethyl acrylate, 3,4-epoxycyclohexylmethyl methacrylate, glycidyl 5-norbornene-2-carboxylate (a mixture of endo and exo forms), glycidyl 5-norbornene-2-methyl-2-carboxylate (a mixture of endo and exo forms), 1,2-epoxy-5-hexene, and 1,2-epoxy-9-decene.

2. The reactive transparent polyimide precursor according to claim 1, wherein the weight average molecular weight of said reactive transparent polyimide precursors is within a range of 2,000 to 200,000.

* * * * *